US006862228B2

(12) United States Patent
Hung et al.

(10) Patent No.: US 6,862,228 B2
(45) Date of Patent: Mar. 1, 2005

(54) HIGH RELIABLE REFERENCE CURRENT GENERATOR FOR MRAM

(75) Inventors: Chien-Chung Hung, Hsinchu (TW); Ming-Jer Kao, Hsinchu (TW); Tsung-Ming Pan, Hsinchu (TW); Yung-Hsiang Chen, Hsinchu (TW)

(73) Assignee: Industrial Technology Research Institute, Chutung Hsinchu (TW)

( * ) Notice: Subject to any disclaimer, the term of this patent is extended or adjusted under 35 U.S.C. 154(b) by 0 days.

(21) Appl. No.: 10/882,350

(22) Filed: Jul. 2, 2004

(65) Prior Publication Data

US 2004/0252557 A1 Dec. 16, 2004

Related U.S. Application Data

(62) Division of application No. 10/653,992, filed on Sep. 4, 2003, now Pat. No. 6,791,887.
(60) Provisional application No. 60/438,320, filed on Jan. 7, 2003.

(51) Int. Cl.[7] .................................................. G11C 7/14
(52) U.S. Cl. .................. 365/189.09; 365/158; 365/173; 365/171; 365/210; 365/209
(58) Field of Search .......................... 365/158, 189.09, 365/173, 171, 210, 209, 225.5

(56) References Cited

U.S. PATENT DOCUMENTS

| | | | |
|---|---|---|---|
| 6,385,111 B2 | 5/2002 | Tran et al. ................... 365/210 |
| 6,392,923 B1 | 5/2002 | Naji ............................ 365/158 |
| 6,426,907 B1 * | 7/2002 | Hoenigschmid ............ 365/210 |
| 6,445,612 B1 | 9/2002 | Naji ............................ 365/158 |
| 6,512,689 B1 * | 1/2003 | Naji et al. ................... 365/158 |
| 6,590,804 B1 * | 7/2003 | Perner ........................ 365/158 |
| 6,621,729 B1 * | 9/2003 | Garni et al. ................ 365/158 |

* cited by examiner

*Primary Examiner*—Andrew Q. Tran
(74) *Attorney, Agent, or Firm*—Bacon & Thomas, PLLC

(57) ABSTRACT

The present invention relates to a simplified reference current generator for a magnetic random access memory. The reference current generator is positioned in the vicinity of the memory cells of the magnetic random access memory, and applies reference elements which are the same as the magnetic tunnel junctions of the memory cell and bear the same cross voltages. The plurality of reference elements are used for forming the reference current generator by one or several bit lines, and the voltage which is the same as the voltage of the memory cell is crossly connected to the reference elements so as to generate a plurality of current signals; and a peripheral IC circuit is used for generating the plurality of midpoint reference current signals and judging the data states. Thanks to the midpoint current reference signals, the multiple-states memory cell, including the 2-states memory cell, can read data more accurately.

4 Claims, 8 Drawing Sheets

HIGH RELIABLE REFERENCE CURRENT GENERATOR FOR MRAM

This application is a Division of nonprovisional application Ser. No. 10/653,992 filed Sep. 4, 2003. Now U.S. Pat. No. 6,791,887 which claims the benefit of U.S. Provisional Application 60/438,320 filed Aug. 7, 2003.

BACKGROUND OF THE INVENTION

1. Field of the Invention

The present invention relates to a reference current generator for a magnetic random access memory, and particularly, to a reference current generator capable of generating a precise and a reliable reference midpoint current signal.

2. Description of the Prior Art

The magnetic random access memory (MRAM) has the advantages of non-volatility, high density, high speed for reading and writing, anti-radiation and so on. When reading the data of the memory, there must be provided a current source or voltage source to be flowed into the selected magnetic tunnel junction (MTJ) for reading the difference of the magneto-resistance value so as to determine the digit value for the data. When writing the data into the memory, the typical method is to use two electrical streamlines (bit line and write word line) to induce the position of the MTJ selected by the biaxial magnetic field so as to change the direction of magnetization of the magnetic tunnel junction and change its data state. FIG. 1 is a perspective diagram of a prior art magnetic random access memory. The MTJ between the bit line and the write word line is a multi-layered magnetic material with stacked structure. Basically, the structure comprises a soft magnetic layer, a nonmagnetic conductor layer or a tunnel barrier layer, and a hard magnetic layer. By judging the parallel or non-parallel for the direction of magnetization of the two magnetic layers, "1" or "0" state of the memory can be determined. Now in the main structure of the MRAM, the memory cell is composed of 1T and 1MTJ and called as 1T1MTJ structure. The size of the memory cell is about 20 $F^2$ (F is the characteristic size of the technology node). FIG. 2 is a perspective diagram of the 1T1MTJ structure of the prior art magnetic random access memory. The plurality of the write word lines 11 and bit lines 13 are mutually perpendicular and crosses, and among them, a plurality of magnetic tunnel junctions 10 and a plurality of transistors 15 are interlaced. Furthermore, the prior art technology provides the structures with different resistance characteristics to be in parallel connection so as to largely reduce the memory bit size.

The magnetic random access memory cell comprises a plurality of magnetic tunnel junctions with magneto-resistance effect, such as giant magneto resistance (GMR) effect or tunneling magneto resistance (TMR) effect for writing in and reading out the data state. In order to judge the logic state of the data memory, there is a need to provide a reference generator for generating a reference signal to be compared with the memory data. As the size of the MTJ reduces, the difference of signals for sensing the memory cell gradually reduces, and since the non-uniformity of manufacturing factors causes the characteristic of the MRAM array MTJ different from each other, there is a possibility that error occurs in the reading of the memory data. Take the 1T2MTJ structure for example, which uses two magnetic tunnel junctions with different resistance characteristics and one transistor, to form the memory reading mechanism with 4-states needs a signal generator capable of providing three reference signals for judging the logical value of the data. Similarly, take the 1T3MTJ structure for example, which uses three magnetic tunnel junctions with different resistance characteristics and one transistor, to form the memory reading mechanism with 8-states needs a signal generator for providing seven reference signals so as to judge the logical value of the data.

FIG. 3A is a perspective diagram of the selection for the prior art midpoint resistance value, and FIG. 3B is a perspective diagram of structure of the prior art midpoint resistance reference cell. The prior art 1T1MTJ structure applies a midpoint resistance reference generator. The midpoint resistance value $R_{mid}$ is the equivalent value obtained by mutually connecting the maximum resistance value ($R_{max}$) 10 and the minimum resistance value ($R_{min}$) 10' in the memory cell in series and then in parallel. However, because the voltage drops of the MTJ element in the reference cell and in the memory cell are different, the reference signals generated by using this method will be deviated. As the size of the MTJ continuously reduces, the noise margin will shrink so as to cause the data misjudgment. Furthermore, the method for serial/parallel connection requires complicated wiring and mask layout, and when it is applied in the 1T2MTJ structure, especially the 1T3MTJ structure and more, the size of the reference generator will become enormous.

SUMMARY OF THE INVENTION

In order to resolve the drawbacks of the prior art, the present invention applies a simplified reference current generator for a magnetic random access memory to generate a reference midpoint current signal to be compared with the memory data in the magnetic random access memory so as to resolve the misjudgment caused by the non-uniformity between the magnetic tunnel junctions due to the manufacture factors. Furthermore, by connecting more than two sets of reference current generators in parallel, the deviations or faults of the magnetic tunnel junctions in the generator will be corrected so as to provide the more accurate reference signals. The reference generator according to the present invention is positioned in the vicinity of the memory cells of the magnetic random access memory, and applies reference elements which are the same as the magnetic tunnel junctions of the memory cells and bear the same cross voltages. Therefore, the reference signal will not be deviated by the bias dependence effect of the magnetic tunnel junction (MTJ) in the magnetic memory. The plurality reference elements are used for forming the reference current generator by applying one or several bit lines, and the voltage which is the same as the voltage of the memory cell is crossly connected to the reference elements so as to generate a plurality of current signals; and a peripheral IC circuit is used for dividing the plurality of current signals into half the reference signals so as to obtain a plurality of midpoint current reference signals. The midpoint current reference values are provided to the multiple-states memory cells, such as the 2-states, 4-states, and 8-states memory cells, for reading data.

BRIEF DESCRIPTION OF THE DRAWINGS

The accompanying drawings, which are incorporated in and form part of the specification in which like numerals designate like parts, illustrate preferred embodiments of the present invention and together with the description, serve to explain the principles of the invention. In the drawings.

DETAILED DESCRIPTION OF THE PREFERRED EMBODIMENT

Figure 1:
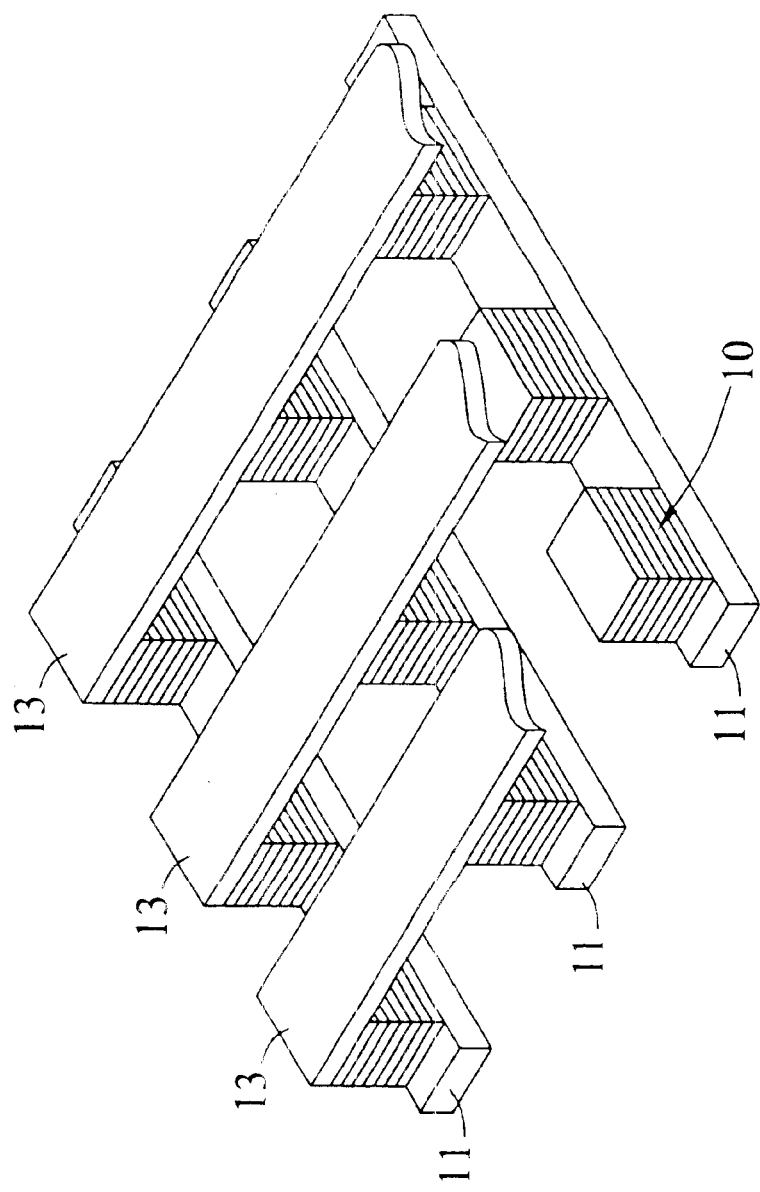
FIG. 1 is a perspective diagram of a prior art magnetic random access memory.
Figure 2:
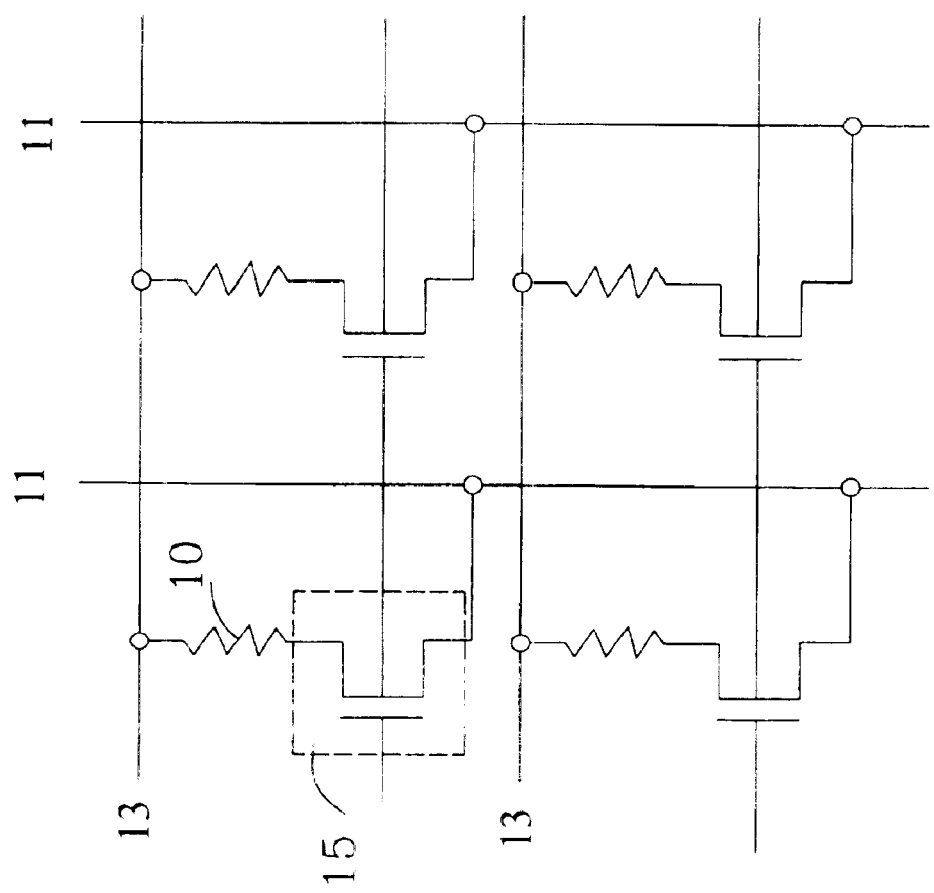
FIG. 2 is a perspective diagram of 1T1MTJ structure of the prior art magnetic random access memory.
Figures 3A, 3B:
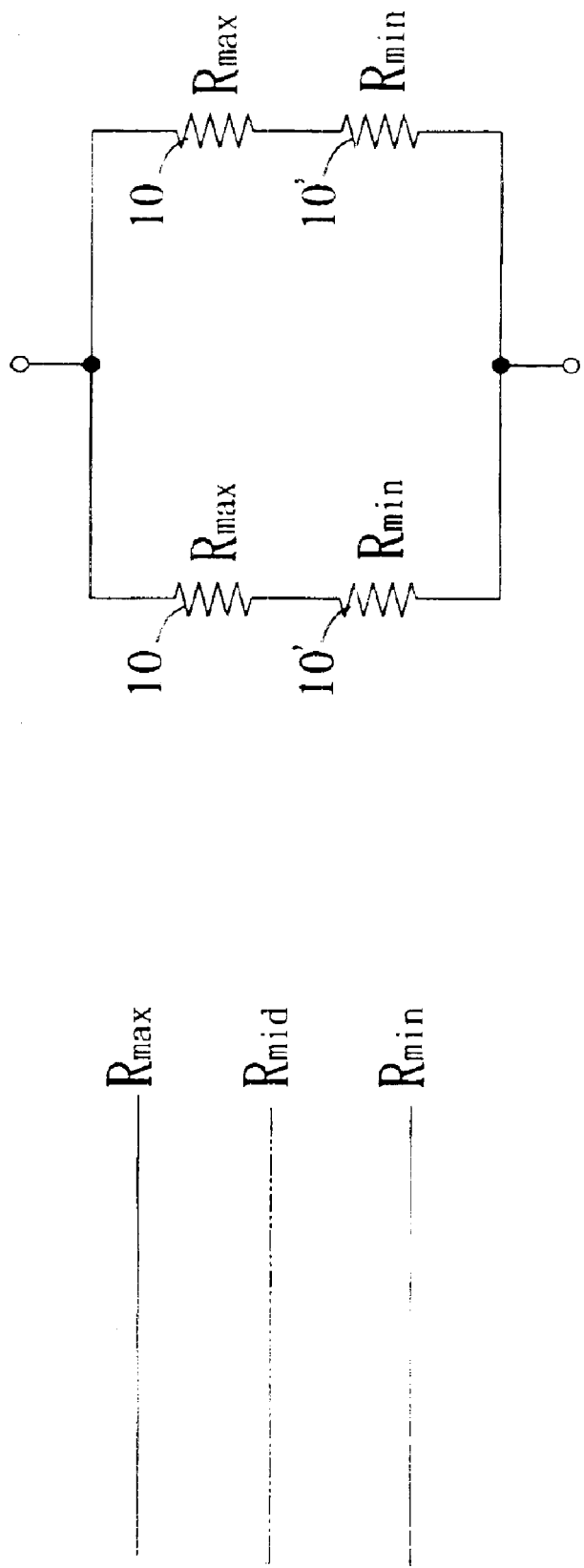
FIG. 3A is a perspective diagram of the selection for the prior art midpoint resistance value.
FIG. 3B is a perspective diagram of structure of the prior art midpoint resistance reference cell.
Figure 4:
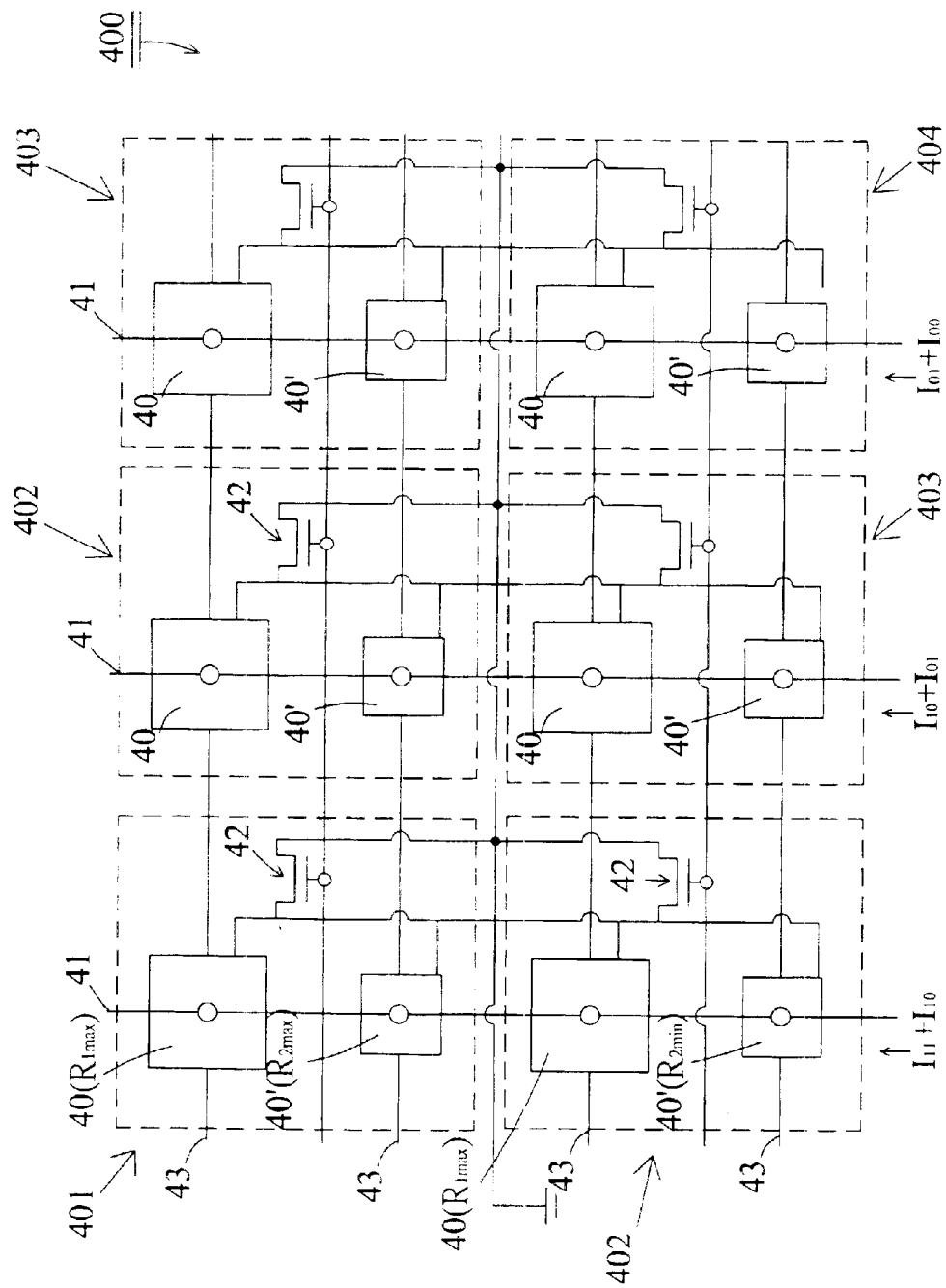
FIG. 4 is a perspective diagram of the circuit of a reference current generator according to the present invention.

Please refer to FIG. 4. FIG. 4 is a perspective diagram of the circuit of a reference current generator according to the present invention. The plurality of 1T2MTJ structures (2MTJ are two magnetic tunnel junction 40 and 40' with different resistance characteristics R1, R2, and 1T is a transistor 42) apply a plurality of bit lines 41, and a plurality of write word lines 43 to be interlaced so as to form a reference current generator 400 with 4-states memory cell having four memory states $R_{1max}//R_{2max}$, $R_{1max}//R_{2min}$, $R_{1min}//R_{2max}$ and $R_{1min}//R_{2min}$. The first memory cell 401 is composed of magnetic tunnel junction 40, 40' with different resistance characteristic $R_1$, $R_2$ and one transistor 42 so as to form 1T2MTJ structure. The transistor 42 is used for controlling the reading switch of the MTJ. The first memory cell 401 is preset with $R_{1max}$ MTJ 40 and $R_{2max}$ MTJ 40' and generates current value I11. Similarly, the second memory cell 402 is preset with $R_{1max}$ MTJ 40, and $R_{2min}$ MTJ 40', and generates current value $I_{10}$. Therefore, the four magnetic tunnel junctions 40, 40' on the most left bit line 41 of the 4-states reference cells generate the first reference current signal ($I_{11}+I_{10}$). Similarly, the third memory cell 403 is preset with $R_{1min}$ MTJ 40 and $R_{2max}$ MTJ 40' and generates the current value $I_{01}$. Therefore, the four magnetic tunnel junctions 40, 40' on the middle bit line 41 generate the second reference current signal ($I_{10}+I_{01}$). Furthermore, the fourth memory cell 404 is preset with $R_{1min}$ MTJ 40 and $R_{2min}$ MTJ 40' and generates the current value $I_{00}$. Therefore, the four magnetic tunnel junctions 40, 40' on the most right bit line 41 generate the third reference current signal ($I_{01}+I_{00}$). Because the magnetic tunnel junctions 40, 40' in the reference generator bear the same voltages as the MTJs in the main memory, they have the same magnetic resistance and bias dependence as the MTJs. The above three reference current signals ($I_{11}+I_{10}$), ($I_{10}+I_{01}$) and ($I_{01}+O_{00}$) are transmitted to the peripheral read-out circuit (not shown) and then divided by 2 so as to obtain three midpoint current reference signals, ($I_{11}+I_{10}$)/2, ($I_{10}+I_{01}$)/2 and ($I_{01}+I_{00}$)/2. Because the peripheral read-out circuit is made by conventional IC manufacture process, it is very precise, and the reference midpoint current signals generated by this method is compared with the sensing signal of the memory cell so as to obtain the more accurate judgment data.

Figure 5:
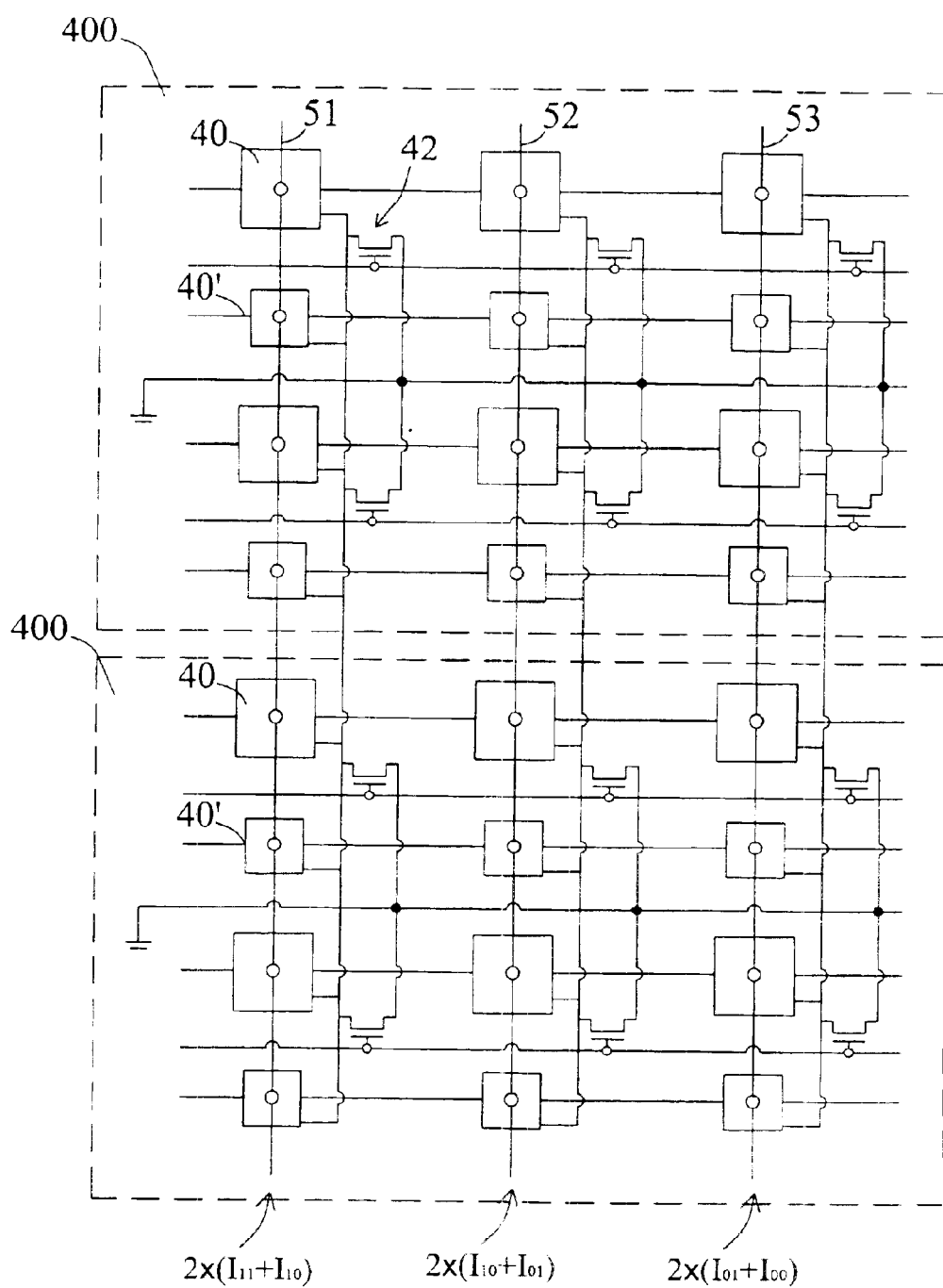
FIG. 5 is a perspective diagram of the parallel connection circuit of a reference current generator.

Please refer to FIG. 5. FIG. 5 is a perspective diagram of the parallel connection circuit of a reference current generator 500 according to the present invention. The bit lines 51,52,53 are used for connecting two 4-states reference current generators 400 of FIG. 4 in parallel so as to generate the accumulated reference current to be sent to the peripheral read-out circuit. The circuit will divide the reference current value by 4 so as to obtain a more precise reference midpoint current signal. The two reference current generators 400, 400 commonly use the first bit line 51 and so as to generate the current value $2\times(I_{11}+I_{10})$, and further commonly use the second bit line 52 so as to generate the current value $2\times(I_{10}+I_{01})$, and the third bit, line 53 generate the current value $2\times(I_{01}+I_{00})$. The peripheral circuit divide the current value $2\times(I_{11}+I_{10})$ generated by the first bit line 51 by 4 so as to generate a precise midpoint current value ($I_{11}+I_{10}$)/2. By applying this method, the average value of the magnetic tunnel junction signal in the reference current generator can be obtained so as to eliminate the shift of the reference signal caused by the deviation or fault of the magnetic tunnel junction in the reference generator. Therefore, the bit error rate of the memory data can be decreased. Similarly, by connecting N reference generators 400 in parallel, one bit line generates the current value $N(I_{11}+I_{10})$ to be transmitted to the peripheral read-out circuit. The circuit will divide the current value by 2N so as to obtain the accurate, highly reliable reference midpoint current signal.

Figure 6:
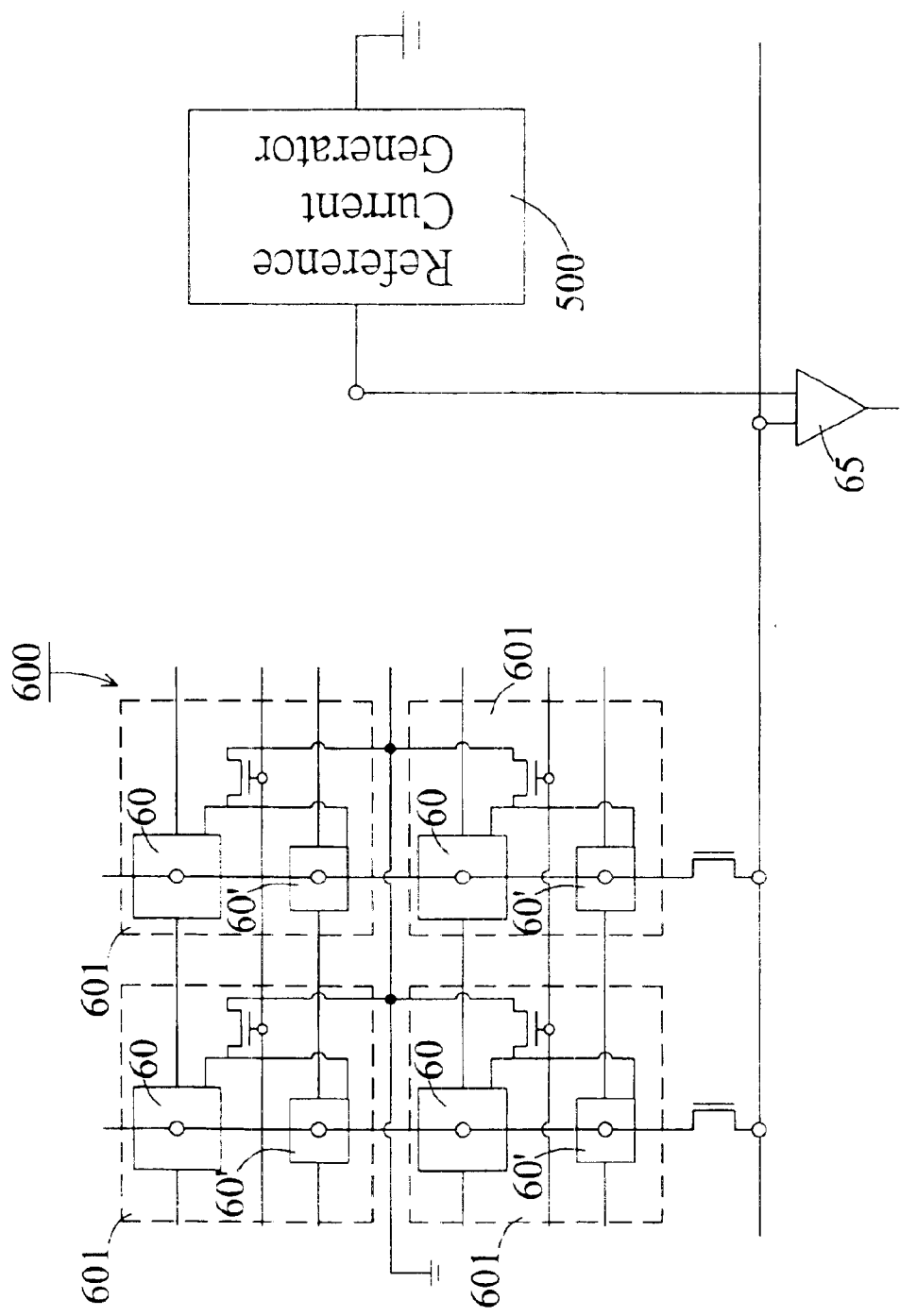
FIG. 6 is a perspective diagram of the combination of a 4-states memory cell and the reference current generator in FIG. 5.

FIG. 6 is a perspective diagram of the combination of a 4-states memory array 600 and the reference current generator 500 in FIG. 5. The memory cell 601 of the memory array 600 comprises magnetic tunnel junctions 60, 60' with different resistance characteristics ($R_1$, $R_2$). When the same voltages are crossly connected, the current signals $I_{11}$, $I_{10}$, $I_{01}$, or $I_{00}$ will be possibly generated. The reference current generator 500 according to the present invention is positioned in the vicinity of the memory array 600. One of the four current signals $I_{11}$, $I_{10}$, $I_{01}$, and $I_{00}$ generated by the memory array 600 and the three current signals generated by the reference current generator 500 are simultaneously transmitted into the sense amplifier (namely, the peripheral reading circuit) 65 so as to generate three midpoint current reference values ($I_{11}+I_{10}$)/2, ($I_{10}+I_{01}$)/2 and ($I_{01}+I_{00}$)/2. The four data states of memory cells 601 are distinguished by the three midpoint current reference signals so as to obtain the logic states of the magnetic tunnel junction 60, 60'.

Figure 7:
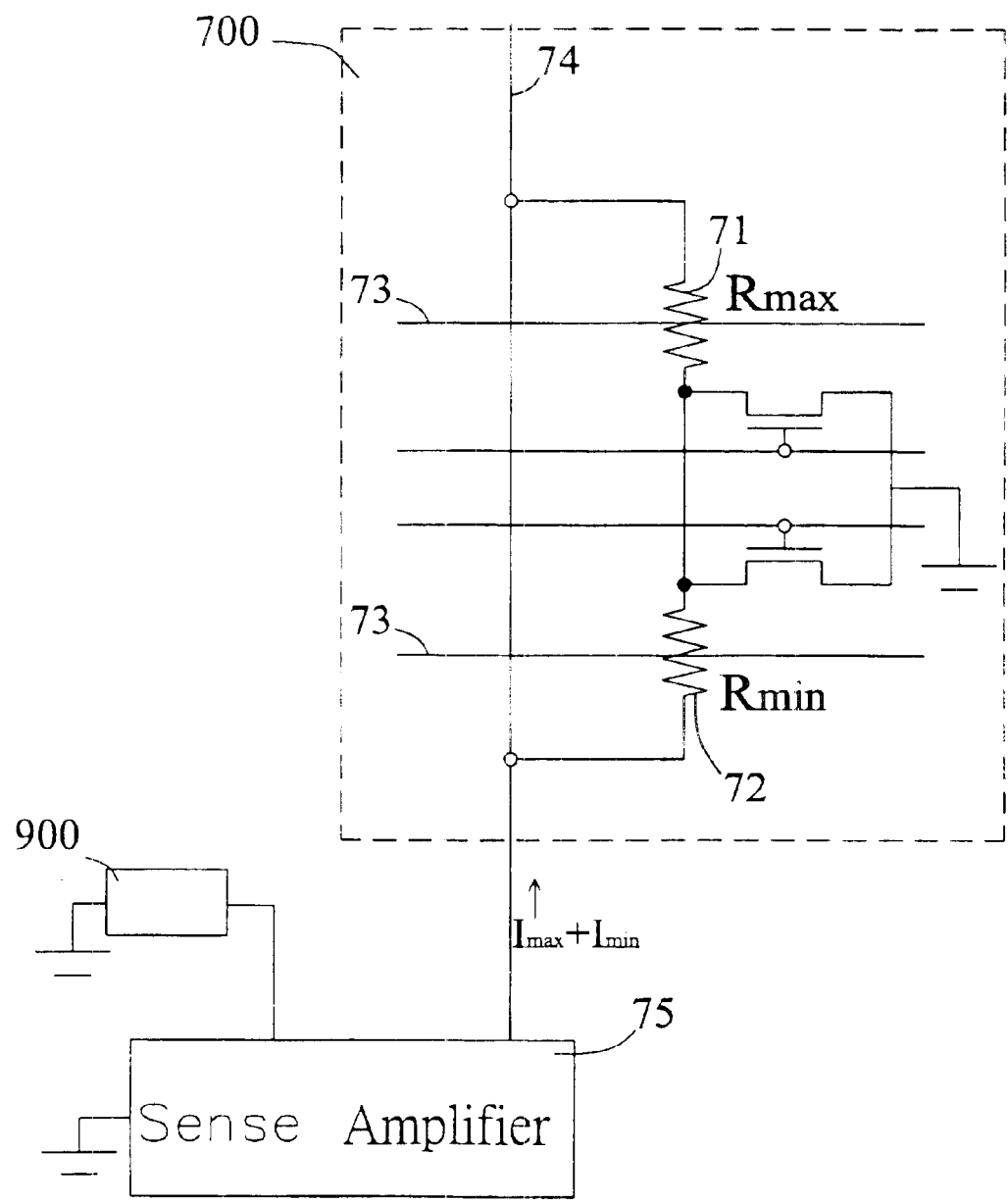
FIG. 7 is a perspective diagram of a reference current generator according to another embodiment of the present invention.

FIG. 7 is a perspective diagram of a reference current generator 700 according to another embodiment of the present invention. The 2-states memory cell with 1 T1MTJ structure is the embodiment. The first MTJ 71 and second MTJ 72 are preset with two resistance values, ($R_{max}$, $R_{min}$) and are separately crossly connected to the two write word lines 73, and the voltage the same as that used by the MTJ of the memory array 900 is crossly connected on them so as to generate the current $I_{max}+I_{min}$ to be transmitted to the sense amplifier 75 via the bit line 74 so as to generate the reference midpoint current signal. The reference midpoint current signal is compared with the sensing current signal transmitted by the memory array 900 so as to avoid the deviation of the reference signal caused by the bias dependence of the magnetic tunnel junction.

Figure 8:
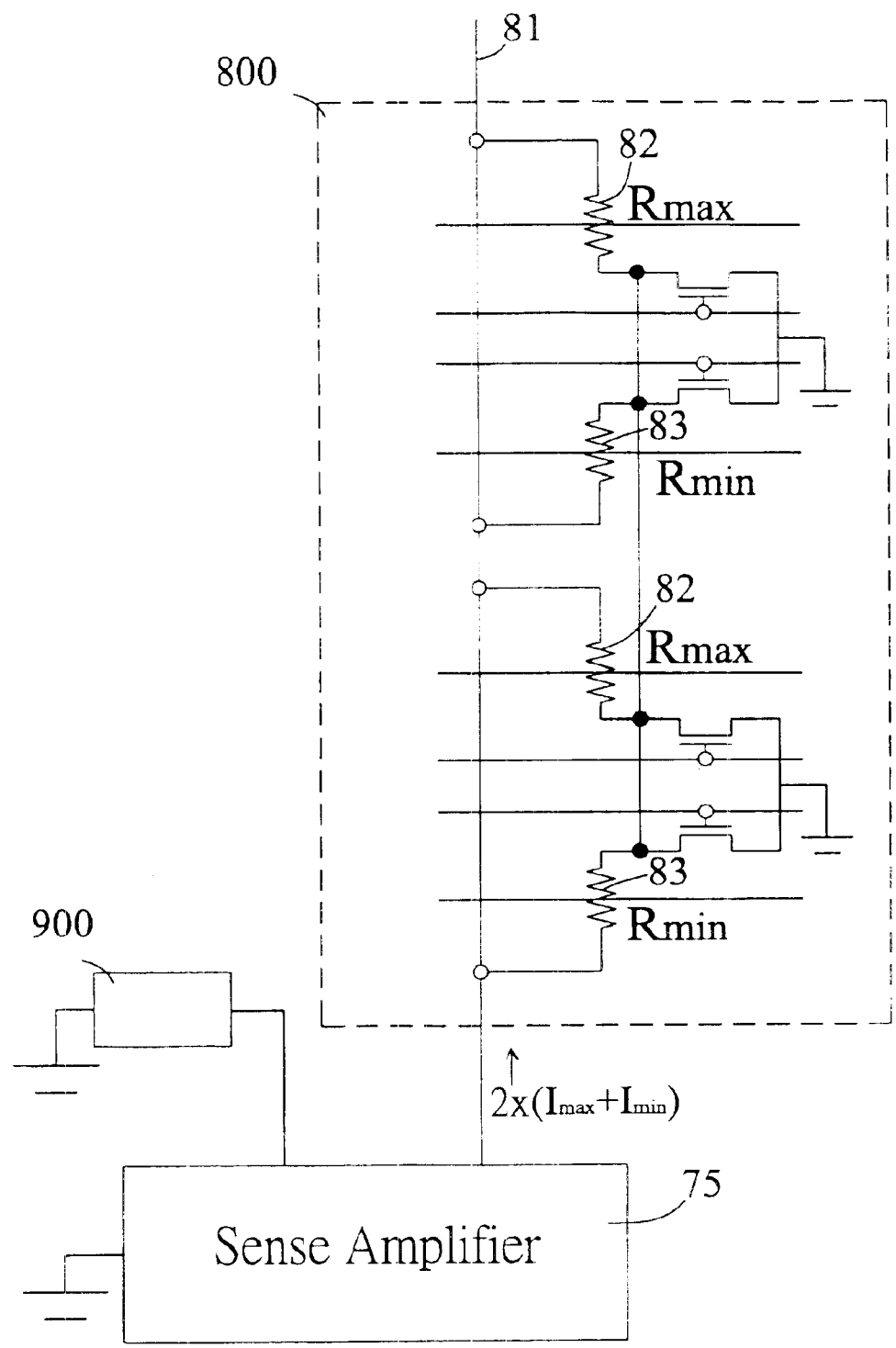
FIG. 8 is a perspective diagram of a reference current generator combined by connecting two reference current generators in FIG. 7 in parallel.

FIG. 8 is a perspective diagram of a reference current generator 800 combined by connecting two reference current generators 700 in FIG. 7 in parallel. The memory cell is preset with a first MTJ 82 and a second MTJ 83 having resistance states $R_{max}$ and $R_{min}$, respectively. Similarly, the voltage the same as that of the memory array 900 is crossly connected on the memory cell so as to generate the current $2\times(I_{max}+I_{min})$ to be transmitted into the sense amplifier 75 via the commonly-used bit line 81. Therefore, the accurate reference midpoint current value is generated and then compared with the memory data of the memory array 900. By using the bit line 81, the N reference current generators are connected in parallel so as to generate the current value $N(I_{max}+I_{min})$ to be transmitted to the sense amplifier 75. The current value $N(I_{max}+I_{min})$ is divided by 2N so as to generate the more accurate reference midpoint current signal $(I_{max}+I_{min})/2$. Therefore, the shift of the reference signal caused by the deviation or fault of the magnetic tunnel junction in the reference current generator can be avoided.

In summary, the reference current generator according to the present invention apply magnetic tunnel junctions which are the same as a plurality of memory cells and bear the same cross voltages so as to generate reference current signals. The conventional IC circuit will divide the reference current signals by 2 so as to generate the precise midpoint current reference signal to be compared with the sensing current of the memory array. Furthermore, by connecting several reference current generators in parallel, the deyiation of fault effects of the reference current generator can be so eliminated that the reference signal can be more accurate and then the misjudgment of the memory data can be avoided. The reference current generator according to the present invention can be provided to the multiple-states memory cell, such as 2-states, 4-states and 8-states memory cells for reading data.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A reference midpoint current generator for a magnetic random access memory being provided to 2-states memory cell for data reading, comprising:

more than one reference elements using one bit line; the reference element being the same as the magnetic tunnel junction of the memory cell and bearing the same voltage as the magnetic tunnel junction;

a voltage the same as the memory cell being crossly connected to the reference element so as to generate a current signal; a peripheral IC circuit dividing the current signal by 2 to obtain a midpoint current reference signal.

2. The reference midpoint current generator of claim 1, wherein the reference element is preset with two memory states, $R_{max}$ and $R_{min}$, where, the current signal $(I_{max}+I_{min})$ and midpoint current reference value $(I_{max}+I_{min})/2$ are generated.

3. The reference midpoint current generator of claim 1, wherein more than two (N) reference current generators are connected in parallel so as to generate a more accurate reference midpoint current signal.

4. The reference midpoint current generator of claim 3, wherein the current signal $N(I_{max}+I_{min})$ is generated, and divided by the peripheral IC circuit by 2N so as to obtain a midpoint current reference value $(I_{max}+I_{min})/2$.

* * * * *